United States Patent [19]
DoMinh et al.

[11] Patent Number: 5,925,498
[45] Date of Patent: *Jul. 20, 1999

[54] PHOTOSENSITIVE POLYMER COMPOSITION AND ELEMENT CONTAINING PHOTOSENSITIVE POLYAMIDE AND MIXTURE OF ACRYLATES

[75] Inventors: Thap DoMinh, Rochester, N.Y.; Paul R. West, Ft. Collins, Colo.; Jeffery A. Gurney, Greeley, Colo.; John Kalamen, Loveland, Colo.; Christopher J. Kloxin, Greeley, Colo.

[73] Assignee: Kodak Polychrome Graphics LLC, Norwalk, Conn.

[ * ] Notice: This patent is subject to a terminal disclaimer.

[21] Appl. No.: 08/876,525

[22] Filed: Jun. 16, 1997

[51] Int. Cl.$^6$ .............................. G03F 7/028; G03F 7/038; G03F 7/09
[52] U.S. Cl. ..................................... 430/278.1; 430/283.1; 430/285.1; 430/273.1
[58] Field of Search .............. 430/283.1, 285.1, 430/278.1, 273.1

[56] References Cited

U.S. PATENT DOCUMENTS

| | | | |
|---|---|---|---|
| 2,732,301 | 1/1956 | Robertson et al. | 95/7 |
| 3,030,208 | 4/1962 | Scheilenberg | 96/35 |
| 3,622,320 | 11/1971 | Allen | 96/28 |
| 3,702,765 | 11/1972 | Laakso | 96/33 |
| 3,929,489 | 12/1975 | Arcesi et al. | 96/115 |
| 3,987,037 | 10/1976 | Bonham et al. | 260/240 |
| 4,062,686 | 12/1977 | Van Allen et al. | 96/115 R |
| 4,239,850 | 12/1980 | Kita et al. | 430/285.1 |
| 4,258,123 | 3/1981 | Nagashima et al. | 430/285.1 |
| 4,414,312 | 11/1983 | Goff et al. | 430/283.1 |
| 4,416,973 | 11/1983 | Goff | 430/283.1 |
| 4,454,220 | 6/1984 | Goff | 430/311 |
| 4,458,007 | 7/1984 | Geissler et al. | 430/284.1 |
| 4,481,276 | 11/1984 | Ishikawa et al. | 430/920 |
| 4,505,793 | 3/1985 | Tamoto et al. | 204/159 |
| 5,045,432 | 9/1991 | West et al. | 430/278.1 |
| 5,061,600 | 10/1991 | West et al. | 430/273.1 |
| 5,085,975 | 2/1992 | Mueller | 430/285.1 |
| 5,141,842 | 8/1992 | Mitchell et al. | 430/285.1 |

FOREIGN PATENT DOCUMENTS 0453237 10/1991 European Pat. Off. .
0 601 203 A1 6/1994 European Pat. Off. .

*Primary Examiner*—Cynthia Hamilton
*Attorney, Agent, or Firm*—Ratner & Prestia

[57] ABSTRACT

A photosensitive composition can be used to prepare negative-working photosensitive elements such as lithographic printing plates. The composition includes a first photocrosslinkable aromatic resin having photocrosslinkable groups and a number average molecular weight of at least about 1500. Also included is a mixture of a polyalkyleneglycol diacrylate and polyacrylate polymerizable monomers, a photocrosslinkable polyester, a photoinitiator, and a photosensitizer. The photosensitive resins are present at a total weight ratio to the polymerizable monomers of at least 1.5:1.

23 Claims, No Drawings

PHOTOSENSITIVE POLYMER COMPOSITION AND ELEMENT CONTAINING PHOTOSENSITIVE POLYAMIDE AND MIXTURE OF ACRYLATES

PRIOR-FILED APPLICATIONS

Commonly assigned U.S. Ser. No. 08/769,362, filed by Thap DoMinh on Dec. 19, 1996.

Commonly assigned U.S. Ser. No. 08/794,156, filed by Thap DoMinh on Dec. 19, 1996.

Commonly assigned U.S. Ser. No. 08/770,749, filed by Thap DoMinh and John Kalamen on Dec. 19, 1996.

FIELD OF THE INVENTION

This invention relates to a photosensitive composition containing a mixture of photocrosslinkable polymers and a mixture of certain polymerizable acrylate monomers. Such compositions are useful in the production of photosensitive elements such as lithographic printing plates.

BACKGROUND OF THE INVENTION

The art of lithographic printing is based upon the immiscibility of oil and water, wherein the oily material or ink is preferentially retained by the image area and the water or fountain solution is preferentially retained by the non-image areas. When a suitably prepared surface is moistened with water and an ink is then applied, the background or non-image areas accept the ink and repel the water. The ink on the image areas is then transferred to the surface of a material in which the image is to be reproduced, such as paper or cloth.

Negative-working lithographic printing plates are prepared from negative-working radiation-sensitive compositions that are formed from polymers that crosslink in radiation-exposed areas. A developing solution is used to remove the unexposed areas of the plates to thereby form a negative image.

The most widely used type of negative-working lithographic printing plates comprises a layer of a radiation-sensitive composition applied to an aluminum substrate and commonly includes a subbing layer or interlayer to control the bonding of the radiation-sensitive layer to the substrate. The aluminum substrate is typically provided with an anodized coating formed by anodically oxidizing the aluminum in an aqueous electrolyte solution.

It is well known to prepare negative-working lithographic printing plates using a radiation-sensitive composition that includes a photocrosslinkable polymer containing the photosensitive group, —CH=CH—CO— as an integral part of the polymer backbone [see for example, U.S. Pat. No. 3,030,208 (Schellenberg et al), U.S. Pat. No. 3,622,320 (Allen), U.S. Pat. No. 3,702,765 (Laakso) and U.S. Pat. No. 3,929,489 (Arcesi et al)]. A very common commercially useful photocrosslinkable polymer in lithographic printing plates is a polyester prepared from diethyl p-phenylenediacrylate and 1,4-bis(β-hydroxyethoxy)-cyclohexane.

Polyesters that are especially useful in the preparation of lithographic printing plates are those which incorporate ionic moieties derived from monomers such as dimethyl-3,3'-[(sodioimino)disulfonyl]dibenzoate and dimethyl-5-sodiosulfoisophthalate. Polyesters of this type are well known and are described, for example, in U.S. Pat. No. 3,929,489 (Arcesi). One polyester of this type is poly[1,4-cyclohexylene -bis(oxyethylene)-p-phenylenediacrylate]-co-3,3'-[(sodioimino)disulfonyl]dibenzoate. Another is poly [1,4-cyclohexylene-bis(oxyethylene)-p-phenylenediacrylate]-co-3,3'-[(sodioimino)disulfonyl] dibenzoate-co-3-hydroxyisophthalate.

Various other photocrosslinkable polymers are known for use in lithographic printing plates including the polyimide precursors described in U.S. Pat. No. 4,416,973 (Goff). Such compositions are known for durability, chemical resistance, adhesion to metals and high mechanical strength when photocrosslinked. Well-known sensitizers including coumarins and halogenated triazines, as described for example in U.S. Pat. No. 4,505,793 (Tamoto et al), can also be used in photocrosslinkable compositions.

It is also known to include a polymerizable vinyl monomer in the photosensitive composition to crosslink the photopolymerizable polymers. Various acrylates and methacrylates are known for this purpose. The literature suggests that either di- or triacrylates can be used for this purpose.

EP-A-0 601 203 (Chisso) describes the use of a composition composed of a polyimide, an acrylated isocyanurate and a polyalkylene glycol diacrylate to allegedly provide improved photosensitivity. However, the pre-imidized polyimide resins described in this reference lack crosslinking functionality. They dissolve only in high boiling organic solvents that are expensive and inconvenient for large-scale manufacturing processes. The only use suggested for some polyimide compositions is as insulating layers in electronic materials. Thus, any graphic arts use of such polymers is missing.

Modern commercial printing plates often require a blend of polymers in the photosensitive layer. Unfortunately, some of those required polymers are incompatible with each other or insoluble in coating solvents, thus necessitating multilayer coatings. Thus, there is a need for a photosensitive formulation that can be used to provide a single-layer element. There is also a need to have a photosensitive formulation that has high photosensitivity and wearability (or durability, that is, can be used for long printing runs).

SUMMARY OF THE INVENTION

The present invention overcomes the problems noted above with a photosensitive composition comprising:

a) a resin containing ethylenically unsaturated photocrosslinkable groups, b) a photopolymerizable polyalkyleneglycol diacrylate, c) a photopolymerizable polyacrylate, d) a photocrosslinkable polyester resin, e) a photoinitiator, and f) a photosensitizer, the weight ratio of the total of resin a) and resin d) to the total of compounds b) and c) being at least 1.5:1, and the weight ratio of compound b) to compound c) being at least 1:3, the resin a) having any one of the structures I, II or III:

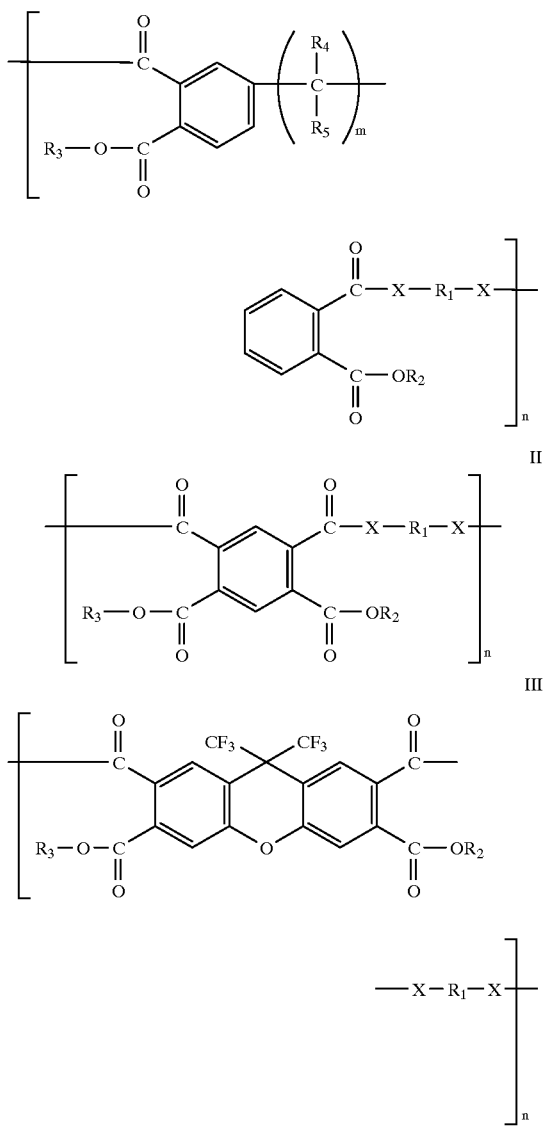

wherein X is —NH—, —O— or —S—, $R_1$ is a divalent aromatic, cycloaliphatic or aliphatic group having at least 2 carbon atoms, $R_2$ and $R_3$ are independently hydrogen or an organic radical containing a photopolymerizable olefinic double bond, provided at least one of $R_2$ and $R_3$ is the organic radical, $R_4$ and $R_5$ are independently a hydrocarbon having 1 to 8 carbon atoms, perfluoro, or a perhalofluoro aliphatic group having 1 to 8 carbon atoms, or together, $R_4$ and $R_5$ form an oxo group, m is 0 or 1, and n is a positive integer corresponding to the number of units in the polymer and is sufficiently large to provide the resin a) with a number average molecular weight of at least about 1500.

This invention also provides a photosensitive element comprising a support and having thereon a photosensitive image-forming layer formed from the photosensitive composition described above.

The photocrosslinkable compositions of this invention have a number of advantages. They contain compatible polymers and polymerizable monomers, and can be readily coated to provide single layer negative-working radiation sensitive elements such as photoresists and lithographic plates. The compositions are easily processed after exposure to remove nonimaged areas with many conventional aqueous developers. Moreover, the compositions exhibit high chemical resistance after thermal crosslinking. This attribute is largely due to the inclusion of the polyamide resin a) described herein (also known as a polyamic acid ester). This resin is not only photochemically curable, but also thermally curable to form the corresponding polyimide, a process known as imidization. The polyimide resin is highly durable and resistant to chemicals.

The photosensitive elements of the present invention are capable of generally high run length, and thus the user has an option of using them for any desired run length. Conventional post-exposure will provide additional crosslinking density in the imaged layer, but the present invention extends run length even further by using the heat-curable polyamide resin a) to form the polyimide.

In addition, the use of a mixture of a specific type of diacrylate (that is, a polyalkyleneglycol diacrylate) and a polyacrylate polymerizable monomer (that is, triacrylate or higher acrylate) provides unexpectedly higher printing plate run length over the use of each type of monomer alone. Moreover, when such diacrylate monomers are used alone, the composition tends to be too oily, and coated layers smear too easily for use in printing plates. The addition of the polyacrylate solves this problem as well. Thus, the monomer mixture solves several problems and provides some unexpected advantages such as extended run length.

DETAILED DESCRIPTION OF THE INVENTION

The photosensitive composition of this invention has six essential components, the first being a resin (identified herein as "resin a") containing ethylenically unsaturated photocrosslinkable groups, and having any one of the structures I, II or III:

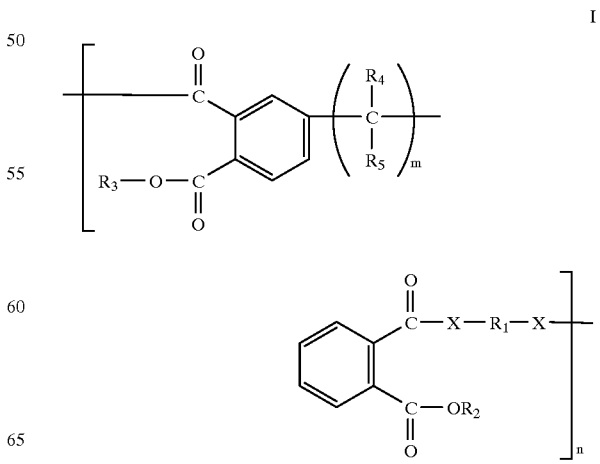

-continued

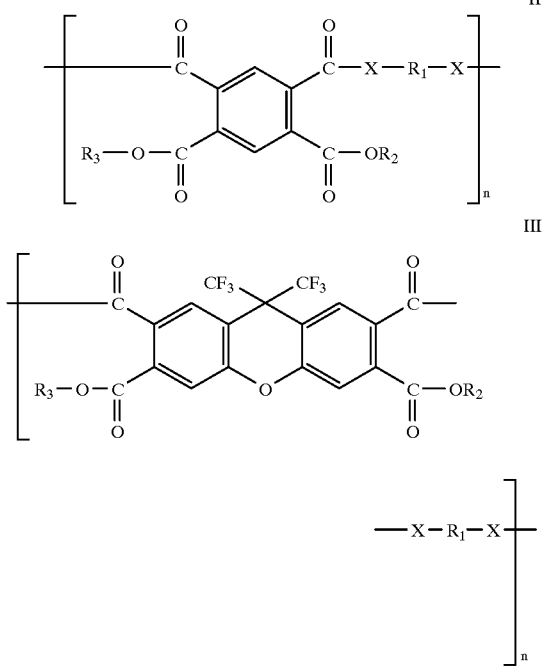

$$-\!\!\!\!-\!\!X\!\!-\!\!R_1\!\!-\!\!X\!\!-\!\!\!\!-_n$$

wherein X is —NH—, —O— or —S—, preferably, —NH— or —O—, and most preferably, —NH—.

$R_1$ is a divalent substituted or unsubstituted aromatic carbocyclic or heterocyclic group (such as arylene including naphthylene or phenylene, or pyrimidylene), a divalent non-aromatic cycloaliphatic group (such as those having 5 to 15 carbon, sulfur, oxygen or nitrogen atoms, including cycloalkyl groups of 5 to 15 carbon atoms, and heterocyclic groups having 5 to 15 carbon and heteroatoms in the ring, including cyclohexylene, pyridinylene and pyridylene) or a divalent substituted or unsubstituted aliphatic group having at least 2 carbon atoms and including substituted or unsubstituted aromatic and non-aromatic groups that can also be connected with one or more oxy, amino, thio, carbonyl, oxycarbonyl, carbonyloxy, sulfonyl, sulfonyloxy or oxysulfonyl (such as alkylene, alkyleneoxyalkylene, alkyleneoxyarylene, arylenethioarylene, aryleneoxyarylene, arylenearylene, aryleneaminoarylene, aryleneoxyarylene, aryleneoxyalkylene and others readily apparent to one skilled in the art), or combinations of any of these. Preferably, $R_1$ is arylene or aryleneoxyarylene as defined above, and most preferably, $R_1$ is phenylene or phenyleneoxyphenylene.

$R_2$ and $R_3$ are independently hydrogen or a substituted or unsubstituted organic radical containing a photopolymerizable olefinic double bond (such as —CH=CH—CO— or equivalent groups where one or more of the hydrogen atoms is replaced with an alkyl group). Preferably, at least one of $R_2$ and $R_3$ (and more preferably, both) is an organic radical containing a photopolymerizable olefinic double bond that allows for crosslinking. The organic radical can include from 2 to 12 carbon, oxygen and sulfur atoms in the radical backbone, and can be substituted with various groups (such as hydroxy) that would be readily apparent to one skilled in the art. Particularly useful organic radicals are —CH$_2$CH$_2$OCOC(CH$_3$)=CH$_2$ and —CH$_2$CH(OH)CH$_2$OCOC(CH$_3$)=CH$_2$ and their acrylate analogs. Other useful organic radicals are described in U.S. Pat. No. 4,416,973 (noted above).

$R_4$ and $R_5$ are independently a hydrocarbon having 1 to 8 carbon atoms (such as substituted or unsubstituted alkyl, cycloalkyl and aryl groups, each of which can be substituted with one or more hydrocarbon groups), perfluoro, or a perhalofluoro aliphatic group having 1 to 8 carbon atoms, or together, $R_4$ and $R_5$ form an oxo group. Preferably, $R_4$ and $R_5$ together form an oxo group. Perfluoro and perhalofluoro aliphatic groups designate groups that contain no hydrogen atoms, and wherein the all-hydrogen atoms are substituted with fluoro or other halo atoms. A preferred perhalofluoro aliphatic group is trifluoromethyl, but others would be readily apparent to one skilled in the art.

In structure I, m is 0 or 1, and preferably, m is 1. Also, in each of the structures, n is a positive integer corresponding to the number of units in the polymer and is sufficiently large to provide resin a) with a number average molecular weight of at least about 1500. Preferably, n is sufficiently large to provide a number average molecular weight of from about 1500 to about 35,000, and more preferably, it is sufficiently large to provide a number average molecular weight of from about 2500 to about 25,000.

More details of useful resin a) materials, including methods of preparation, are described in U.S. Pat. No. 4,416,973 (noted above), incorporated herein by reference. Two or more of such resins can be used, if desired.

A second essential component of the composition of this invention is one or more polyalkyleneglycol diacrylate ethylenically unsaturated photopolymerizable monomers. Such compounds have two acrylate functional groups (or precursor groups that can be converted to acrylate groups). As used herein, the term "diacrylate" is intended to include dimethacrylate compounds as well. Moreover, such compounds also have multiple (two or more, and preferably up to 10) "alkyleneglycol" or "alkyleneoxy" moieties, each moiety generally having from 2 to 6 carbon atoms (preferably from 2 to 4 carbon atoms). Such compounds also include polyalkyleneglycol dimethacrylates and polyalkyleneglycol acrylate-methacrylates. The alkylene moiety can be linear or branched, and substituted or unsubstituted. A mixture of various alkyleneglycol moieties can exist in a given compound. Useful alkylene moieties include, but are not limited to, ethylene, n-propylene, isopropylene, n-butylene, iso-butylene, and others readily apparent to one skilled in the art. Various types of useful monomers are described in EP-A-0 601 203 (noted above).

Particularly useful polyalkyleneglycol diacrylate monomers include, but are not limited to, diethyleneglycol diacrylate (and methacrylate), triethyleneglycol diacrylate (and methacrylate), tetraethyleneglycol diacrylate (and methacrylate), tri-n-propyleneglycol diacrylate (and dimethacrylate), tri-isopropyleneglycol diacrylate (and dimethacrylate), di-n-butyleneglycol diacrylate (and dimethacrylate), diethyleneglycol-tri-isopropyleneglycol diacrylate (and dimethacrylate), and mixtures thereof. Most preferred is tetraethyleneglycol diacrylate.

Also included in the composition of this invention are one or more polyacrylates, that is an ethylenically unsaturated monomer having three or more acrylate (or functional equivalents) functional groups. As used herein "polyacrylate" compounds include polymethacrylate compounds. Representative useful compounds include, but are not limited to, trimethylolpropane trimethacrylate, trimethylolpropane triacrylate, ethoxylated trimethylolpropane triacrylate, ethoxylated trimethylolpropane trimethacrylate, tetramethylolpropane tetraacrylate, pentaerythritol triacrylate, tris(2-hydroxyethyl)isocyanurate triacrylate, and mixtures thereof. Most preferred are pentaerythritol triacrylate and tris(2- hydroxyethyl)-isocyanurate triacrylate. The triacrylates (and trimethacrylates) are preferred.

Both the diacrylates and polyacrylates described above are commercially available from a number of sources.

In the composition, the weight ratio of the noted diacrylate (or mixtures) to polyacrylates (or mixtures) is from about 1:3 and to about 3:1, and preferably, it is from about 1:2 to about 2:1, and most preferably it is from about 2:3 to about 3:2. Optimum is about a 1:1 weight ratio. Thus, a preferred mixture of photopolymerizable monomers is pentaerthritol triacrylate and tetraethyleneglycol diacrylate.

A photocrosslinkable polyester resin (or mixture thereof) is a fourth essential component of the composition of this invention. This resin typically has one or more photosensitive groups, such as a —CH=CH—CO— group. Such groups can be incorporated into the resin backbone, or be groups pendant to the resin backbone. Preferably, the photosensitive groups are an integral part of the resin backbone. The compounds also have aromatic groups.

Representative polyester resins can be prepared from one or more compounds represented by the following structures IV–VIII:

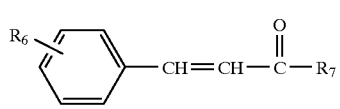

IV wherein $R_6$ is one or more substituted or unsubstituted alkyl groups having 1 to 6 carbon atoms, substituted or unsubstituted aryl having 6 to 12 carbon atoms, substituted or unsubstituted aralkyl having 7 to 20 carbon atoms, substituted or unsubstituted alkoxy having 1 to 6 carbon atoms, nitro, amino, acrylic, carboxyl, or halo, and is chosen to provide at least one condensation site. $R_7$ is hydroxy, substituted or unsubstituted alkoxy having 1 to 6 carbon atoms, halo or oxy if the compound is an acid anhydride. A preferred compound of structure IV is p-phenylene diacrylic acid or a functional equivalent thereof. These and other useful compounds are described in U.S. Pat. No. 3,030,208, U.S. Pat. No. 3,622,320 and U.S. Pat. No. 3,702,765 (noted above), all disclosures of which are incorporated herein by reference.

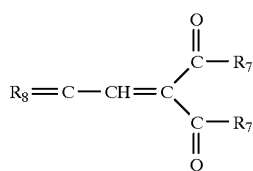

V wherein $R_7$ is as defined above, and $R_8$ is substituted or unsubstituted alkylidene having 1 to 4 carbon atoms, substituted or unsubstituted aralkylidene having 7 to 16 carbon atoms or a 5- or 6-membered heterocyclic ring. Particularly useful compounds of structure VI include, but are not limited to, cinnamylidenemalonic acid, 2-butenylidenemalonic acid, 3-pentenylidenemalonic acid, o-nitrocinnamylidenemalonic acid, naphthylallylidenemalonic acid, 2-furfurylideneethylidenemalonic acid and functional equivalents thereof. These and other useful compounds are described in U.S. Pat. No. 3,674,745 (Philipot et al), the disclosure of which is incorporated herein by reference.

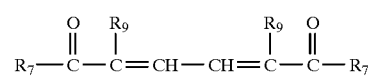

VI wherein $R_7$ is as defined above, and $R_9$ is hydrogen or methyl. Particularly useful compounds of structure VII are trans, trans-muconic acid, cis, trans-muconic acid, cis, cis-muconic acid, α,α'-cis, trans-dimethylmuconic acid, α,α'-cis, cis-dimethylmuconic acid and functional equivalents thereof. These and other useful compounds are described in U.S. Pat. No. 3,615,434 (McConkey), the disclosure of which is incorporated herein by reference.

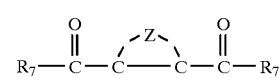

VII wherein $R_7$ is as defined above, and Z represents the atoms necessary to form an unsaturated bridged or unbridged, substituted or unsubstituted carbocyclic nucleus of 6 or 7 carbon atoms. Particularly useful compounds of structure VIII include, but are not limited to, 4-cyclohexene- 1,2-dicarboxylic acid, 5-norbornene-2,3-dicarboxylic acid, hexachloro-5-[2:2:1]-bicycloheptene-2,3-dicarboxylic acid and functional equivalents thereof. These and other useful compounds are described in Canadian Patent 824,096 (Mench et al), the disclosure of which is incorporated herein by reference.

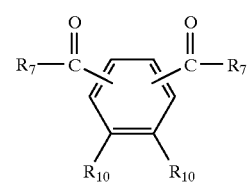

VIII wherein $R_7$ is as defined above, and $R_{10}$ is hydrogen, substituted or unsubstituted alkyl having 1 to 12 carbon atoms, substituted or unsubstituted cycloalkyl having 5 to 12 carbon atoms or substituted or unsubstituted aryl having 6 to 12 carbon atoms. $R_{10}$ can be substituted with any group that does not interfere with the condensation reaction, such as halo, nitro, aryl, alkoxy, aryloxy and others readily apparent to those skilled in the art. Particularly useful compounds include, but are not limited to, 1,3-cyclohexadiene-1,4-dicarboxylic acid, 1,3-cyclohexadiene-1,3-dicarboxylic acid, 1,5-cyclohexadiene-1,4-dicarboxylic acid and functional equivalents thereof. These and other useful compounds are described, for example, in Belgian Patent 754,892, the disclosure of which is incorporated herein by reference.

Preferred photocrosslinkable polyesters for use in this invention are the p-phenylene diacrylate polyesters.

A photoinitiator is necessary in the composition of this invention. Useful compounds (or mixtures thereof) include, but are not limited to, aromatic biimidazoles, aromatic ketones, benzoin, benzoin ethers, mercaptobenzothiazoles, mercaptobenzoxazoles, and active halogen compounds, as described for example in U.S. Pat. No. 4,416,973 (noted above) and U.S. Pat. No. 4,505,793 (Tamoto et al), the disclosures of which are incorporated herein by reference.

Particularly useful photoinitiators include the halogenated triazines that are substituted with at least one trihalomethyl group. Such compounds are described in more detail in the noted Tamoto et al patent. Representative compounds include, but are not limited to, 2-phenyl-4,6-bis(trichloromethyl)-s-triazine, 2-(p-chlorophenyl)-4,6-bis(trichloromethyl)-s-triazine, 2-(p-tolyl)-4,6-bis(trichloromethyl)-s-triazine, 2-(p-methoxyphenyl)-4,6-bis(trichloromethyl)-s-triazine, 2-(2', 4'-dichlorophenyl)-4,6-bis(trichloromethyl)-s-triazine, 2,4,6-tris(trichloromethyl)-s-triazine, 2-methyl-4,6-bis(trichloromethyl)-s-triazine, 2-n-nonyl-4,6-bis(trichloromethyl)-s-triazine, and 2-(α,α,β-trichloroethyl)-4,6-bis(trichloromethyl)-s-triazine. In addition, there can be mentioned the compounds described in GB 1,388,492, for example, 2-styryl-4,6-bis(trichloromethyl)-s-triazine, 2-(p-methylstyryl)-4,6-bis(trichloromethyl)-s-triazine, 2-(p-methoxystyryl)-4,6-bis(trichloromethyl)-s-triazine, and 2-(p-methyoxystyryl)-4-amino-6-trichloromethyl-s-triazine. Moreover, the compounds described in *J. Org. Chem.* Vol. 29, page 1527 (1964), for example, 2-methyl-4,6-bis(tribromomethyl)-s-triazine, 2,4,6-tris(tribromomethyl)-s-triazine, 2,4,6-tris(dibromomethyl)-s-triazine, 2-amino-4-methyl-6-tribromomethyl-s-triazine, and 2-methoxy-4-methyl-6-trichloromethyl-s-triazine. Such compounds are readily available from a number of commercial sources.

A most preferred halogenated triazine photoinitiator is bis(trichloromethyl)-1-naphthyltriazine or its 4-methoxy derivative.

Still another essential component of the photosensitive composition of this invention is a photosensitizer (or mixture thereof). Particularly useful photosensitizers include coumarins that have an absorption maximum of from about 250 to about 550 nm. Representative useful coumarins are described in the Tamoto et al patent noted above as 3-keto-substituted coumarins. A particularly useful coumarin is 3,3'-carbonylbis(5,7-di-n-propoxycoumarin).

Other useful photosensitizers include aromatic thiazoline compounds, such as those described for example in U.S. Pat. No. 2,732,301 (Robertson et al).

More particularly, these photosensitizers have the following structure IX or X:

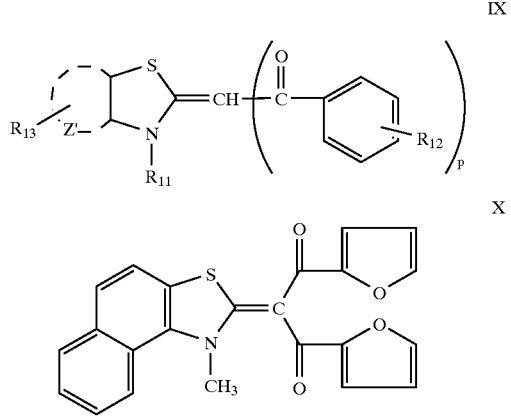

wherein $R_{11}$ is alkyl of 1 to 4 carbon atoms, $R_{12}$ and $R_{13}$ are independently hydrogen, alkyl of 1 to 4 carbon atoms, sulfonic acid (or a salt thereof), chloro or nitro. Preferably, $R_{11}$ is methyl or ethyl, and $R_{12}$ and $R_{13}$ are independently hydrogen or methyl. More preferably, $R_{11}$ is methyl and $R_{12}$ is hydrogen.

Also in structure X, p is 1 or 2, and preferably, p is 1.

Z' represents the carbon atoms necessary to complete a 6- to 10-membered aromatic ring fused with the thiazoline ring. This aromatic ring thus can form a phenyl or naphthyl fused ring, and can be unsubstituted or substituted with one or more alkyl, alkoxy or nitro groups. Preferably, the ring is an unsubstituted naphthyl ring fused with the thiazoline ring.

Representative compounds of structure X or XI that can be used as photosensitizers include, but are not limited to, N-methyl-2-benzoylmethylene-β-naphthothiazoline, N-ethyl-2-benzoylmethylene-β-naphthothiazoline, N-methyl-2-(m-sulfonylbenzoyl)methylene-β-naphthothiazoline pyridinium salt, N-methyl-2-m-chlorobenzoylmethylene-β-naphthothiazoline, N-methyl-2-p-nitrobenzoylmethylene-β-naphthothiazoline, and N-methyl-2-bis(1'-furanoyl)methylene-β-naphthothiazoline. The first compound is most preferred.

In the compositions of this invention, resin a) comprises from about 15 to about 65%, the total of polymerizable monomers (both diacrylates and triacrylates) comprises from about 15 to about 50%, the photocrosslinkable polyester comprises from about 15 to about 65%, the photoinitiator comprises from about 0.5 to about 15%, and the photosensitizer comprises from about 0.1 to about 15%, all based on dry coating weight. Preferable amounts include from about 30 to about 50% of resin a), from about 25 to about 50% of the total of polymerizable monomers, from about 30 to about 50% of the photocrosslinkable polyester, from about 2 to about 12% of the photoinitiator, and from about 1 to about 6% of the photosensitizer, all based on dry coating weight.

Generally, the weight ratio of photoinitiator to photosensitizer is from about 10:1 to about 1:1.

The weight ratio of the total (that is, the sum of weights) of resin a) and resin d) to the total of the monomers b) and c) in the composition is at least 1.5:1, and preferably, at least 2.25:1. Generally, a useful weight ratio range is from about 1.5:1 to about 5:1, with a range of from about 2.25 to about 4:1 being preferred.

The compositions of this invention can also include one or more surfactants, stabilizers, dyes or pigments, plasticizers, binders, anti-scumming agents, antioxidants, extenders, and other addenda commonly employed in such compositions, especially when they are used to prepare photoresists and lithographic printing plates. Such addenda can be included in conventional amounts.

One optional component that can be included in the composition of this invention is a photocrosslinkable copolymer of maleic anhydride and styrene or a styrene derivative. This copolymer is prepared from one or more of styrene or a styrene derivative, and one or more maleic anhydrides, and is subsequently functionalized with a photocrosslinkable group. Such photocrosslinkable groups are well known in the art, but preferred groups include those containing a —CH=CH—CO— group, such as described above for the $R_2$ and $R_3$ groups. Particularly useful photocrosslinkable groups are —CH$_2$CH$_2$OCOC(CH$_3$)=CH$_2$, —CH$_2$CH(OH)CH$_2$OCOC(CH$_3$)=CH$_2$ and their acrylate analogs, but others are well known in the art, including those described in U.S. Pat. No. 4,416,973 (noted above).

The styrene-maleic anhydride copolymer can be esterified with one or more of such photocrosslinkable groups, but preferably, it has the structure XI:

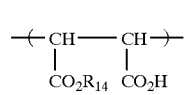

wherein $R_{14}$ is an organic radical having a photocrosslinkable group, as defined above for $R_2$ and $R_3$. Preferably, $R_{14}$ is —CH$_2$CH$_2$OCOC(CH$_3$)=CH$_2$, —CH$_2$CH(OH)CH$_2$OCOC(CH$_3$)=CH$_2$ or their acrylate analogs.

Styrene or styrene derivatives (such as 4-vinyltoluene, α-methylstyrene, 2,5-dimethylstyrene, 4-t-butylstyrene, 2-chlorostyrene and divinylbenzene are copolymerized with the maleic anhydride in various proportions. Copolymers (50:50 weight percent) can be purchased from commercial sources or prepared using standard emulsion polymerization techniques, as described for example by Sorenson et al in *Preparative Methods of Polymer Science,* 2nd Edition (1968), Wiley & Sons, New York, and Stevens, *Polymer Chemistry, An Introduction,* Addison Wesley Publishing Co., London (1975).

It is frequently desirable to add print out or indicator dyes to the photosensitive compositions to provide a colored print out image after exposure. Useful indicator dyes are well known in the art, as described for example in U.S. Pat. No. 5,043,250 (West et al).

The photosensitive compositions of this invention can be prepared by dissolving or dispersing the components in one or more suitable solvents that are commonly employed in the art to prepare polymer dopes. The solvents are chosen to be substantially unreactive toward the polymers and monomer within the time period contemplated for maintaining the solvent(s) and polymers in association, and are chosen to be compatible with the substrate employed for coating. While the best choice of solvent will vary with the exact application under consideration, exemplary preferred solvents include alcohols (such as butanol, benzyl alcohol and 1-methoxy-2-propanol), ketones (such as acetone, 2-butanone and cyclohexanone), butyrolactone, ethers (such as tetrahydrofuran and dioxane), 2-methoxyethyl acetate, N,N'-dimethylformamide, chlorinated hydrocarbons (such as chloroform, trichloroethane, dichloroethane, tetrachloroethane and chlorobenzene), hydrocarbons (such as toluene, xylene and mesitylene). Mixtures of various solvents are preferred since there are several polymeric components in the composition of the invention. For example, a preferred mixture includes toluene, tetrahydrofuran, 1-methoxy-2-propanol and butyrolactone.

The photosensitive elements of this invention include electrical or electronic devices such as semiconductors, capacitors and printed circuits, and lithographic printing plates. Preferred elements are negative-working lithographic printing plates.

The photosensitive elements comprise a support having thereon a layer containing the photosensitive composition of this invention. Such elements can be prepared by forming coatings with the compositions and removing solvent(s) by drying at ambient or elevated temperatures. Any one of a variety of conventional coating techniques can be employed, such as extrusion coating, doctor-blade coating, spray coating, dip coating, whirl coating, spin coating, roller coating and other procedures known in the art.

Suitable supports can be chosen from a wide variety of materials that do not directly chemically react with the coating compositions. Such supports include, but are not limited to, fiber based materials (such as paper, polyethylene-coated papers, polypropylene-coated papers, parchment and cloth), metal sheets and foils (such as aluminum, steel, silver, zinc, copper, gold and platinum), glass and glass coated metals (such as chromium alloys), synthetic resins and polymeric materials [such as poly(alkyl acrylates), poly(alkyl methacrylates), polyesters, poly(vinyl acetals), polyamides, cellulose nitrate, cellulose esters and the like]. Preferred support materials include zinc, anodized aluminum, grained aluminum, and aluminum that has been both anodized and grained, as described in U.S. Pat. No. 4,647,346 (Miller et al) and U.S. Pat. No. 4,865,951 (Huddleston et al), the disclosures of which are incorporated herein by reference.

The support can be preliminarily treated or coated before application of the photosensitive coating of this invention. Known subbing layers can be used if desired, including copolymers of vinylidene chloride and acrylic monomers (such as acrylonitrile, methyl acrylate and methyl methacrylate) and unsaturated dicarboxylic acids (such as itaconic acid and benzoic acid), carboxymethyl cellulose, gelatin, polyacrylamide and similar materials.

The optimum coating thickness of the photosensitive layer will depend upon such factors as the particular application to which the element will be put, and the nature of the various components in the layer. Typical coating thicknesses can be from about 0.05 to about 10 μm or greater, with thicknesses of from about 0.1 to about 2.5 μm being preferred. A protective overcoat prepared from conventional polymeric materials can be used, if desired.

In a preferred embodiment of this invention, a lithographic printing plate comprises an anodized aluminum support and has thereon a photosensitive image-forming layer and a protective overcoat layer, the photosensitive image-forming layer comprising:

a) a polyamide containing ethylenically unsaturated photocrosslinkable groups, b) tetraethyleneglycol diacrylate, c) pentaerythritol triacrylate, d) a photocrosslinkable polyester resin containing aromatic groups having linked thereto photosensitive —CH=CH—CO— or equivalent groups, e) a halogenated triazine photoinitiator and a coumarin sensitizer that has an absorption maximum of from about 250 to about 550 nm, and f) a ketocoumarin photosensitizer, the weight ratio of the total of resin a) and resin d) to monomers b) and c) being from 2.25:1 to 4:1, the resin a) having structure X:

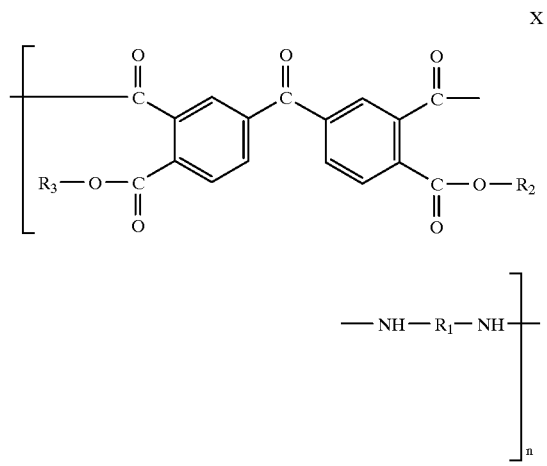

wherein R$_1$ is phenylene or phenyleneoxyphenylene,

R$_2$ and R$_3$ are each —CH$_2$CH$_2$OCOC(CH$_3$)=CH$_2$, and n is a positive integer corresponding to the number of units in the polymer and is sufficiently large to provide said resin a) with a number average molecular weight of from about 1500 to about 35,000.

The elements of this invention can be exposed and processed using conventional procedures and conditions, as described for example in U.S. Pat. No. 5,141,842 (Mitchell et al), the disclosure of which is incorporated herein by reference.

Exposed printing plates can be developed by flushing, soaking, swabbing or otherwise treating the crosslinked photosensitive layer with a developing solution which selectively removes (or dissolves) the unexposed areas of the layer. The developer is preferably an aqueous solution having a pH near neutral. In a preferred form, the developing solution includes a combination of water and an alcohol that is water-miscible, or is rendered water-miscible with a co-solvent or surfactant. Various useful solvents are known in the art. The developing solutions can also contain various addenda, such as surfactants, dyes and/or pigments, anti-scumming agents as are well known in the art.

After development, the elements can be treated in any known manner consistent with its intended use. For example, lithographic printing plates are typically subjected to desensitizing etches or finishing solutions.

The following examples illustrate the present invention and are not meant to be limiting in any way. All percentages are by weight, unless otherwise noted.

EXAMPLE 1

Photosensitive Composition

Photosensitive compositions were prepared by mixing the following components in a solvent-based formulation (weight % of wet formulation):

| INGREDIENT | COMPOSITION A | COMPOSITION B |
|---|---|---|
| Tetraethyleneglycol diacrylate (Sartomer) | 0 | 1.072 |
| Tris(2-hydroxyethyl)isocyanurate triacrylate (Sartomer) | 0 | 1.072 |
| Bis(2-hydroxyethyl methacrylate ester of phosphoric acid) (Kayamer PM-2 from) Nippon Kayaku) | 0.087 | 0 |
| Pentaerythritol triacyrlate (Sartomer) | 2.012 | 0 |
| Polyamic acid ester* (DuPont KG-10602) | 2.406 | 2.406 |
| Photosensitive copolyester** (Eastman Kodak | 1.881 | 1.881 |
| Bis(trichloromethyl)-1-naphthyltriazine | 0.437 | 0.437 |
| 3,3'-carbonylbis(5,7-di-n-propoxycoumarin)(Eastman Kodak) | 0.087 | 0.087 |
| CG 21-1005 oxonal dye (Ciba Geigy) | 0.122 | 0.122 |
| Byk-307 silicone surfactant (Byk Chemie) | 0.012 | 0.012 |
| Tetrahydrofuran | 24.168 | 24.156 |
| Butyrolactone | 12.084 | 12.078 |
| Toluene | 11.154 | 11.149 |
| 1-Methoxy-2-propanol | 45.547 | 45.526 |

*
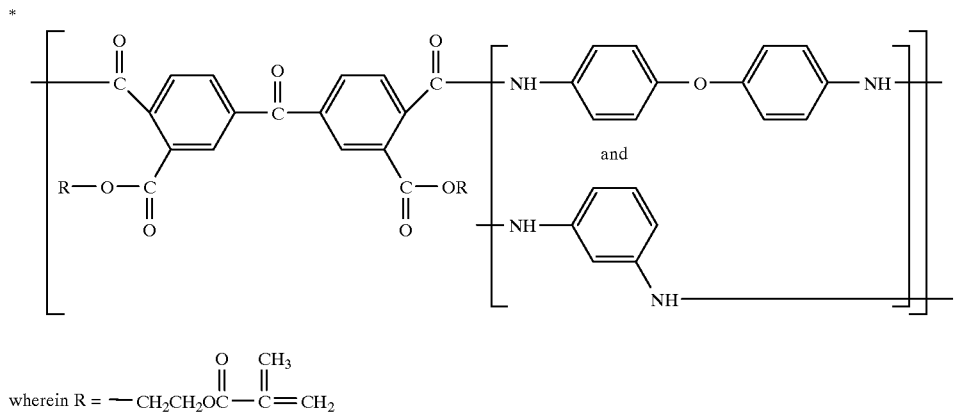

wherein R = —CH$_2$CH$_2$OC(=O)—C(CH$_3$)=CH$_2$

**
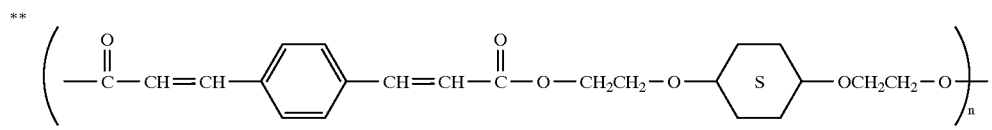

Composition A is a Control composition outside the present invention, but Composition B is a composition of this invention.

EXAMPLE 2

Lithographic Printing Plate

The compositions described in Example 1 were coated on electrochemically grained and anodized aluminum supports that had been treated with vinylphosphonic acid copolymer, as described in U.S. Pat. No. 5,368,974 (Walls et al). The resulting photosensitive layers were applied at a dry coating weight of about 1.5 g/m² to provide a photosensitive layer on each plate having a thickness of about 1.5 μm.

Samples of each type of printing plate (A and B) were imagewise exposed at 40 units through a commercial vacuum exposing frame (OLEC). The plates were then machine processed in a commercially available KODAK N-85 Processor at a rate of about 0.9 m/min using KODAK Production Series Negative Developer, and finished using KODAK Aqua Image Plate Finisher.

Samples of each type of plate were mounted on a commercial Miehle printing press and subjected to an accelerated wear test. Plate A (Control) was judged to have failed after an average of 65,000 impressions, but Plate B (Invention) did not fail until an average of 77,000 impressions had been made. Thus, the mixture of diacrylate and triacrylate monomers in the photosensitive layer provided improved plate run length.

EXAMPLE 3

Additional Comparisons and Printing Plates

Several imaging compositions (weight % of coating composition) as shown the following table were used to prepare printing plates as described in Example 2. The plates were then imaged and processed, and used in printing, as described in Example 2.

Printing plate C (Control) was determined to have failed after only 37,000 impressions. Printing plate D (Control) failed at 65,000 impressions, but it was also unacceptably oily and tacky. Moreover, printing plate E (Control) failed after 60,000 impressions. Printing plate F (Invention) had the longest run length because it did not fail until after 70,000 impressions, and exhibited very good physical characteristics.

The invention has been described in detail with particular reference to preferred embodiments thereof, but it will be understood that variations and modifications can be effected within the spirit and scope of the invention.

We claim:

1. A photosensitive composition comprising:

a) a resin containing ethylenically unsaturated photo-crosslinkable groups, b) a photopolymerizable polyalkyleneglycol diacrylate, c) a photopolymerizable polyacrylate, d) a photocrosslinkable polyester resin, e) a photoinitiator, and f) a photosensitizer, the weight ratio of the total of said resin a) and resin d) to said monomers b) and c) being at least 1.5:1, said resin a) having any of structures I, II or III:

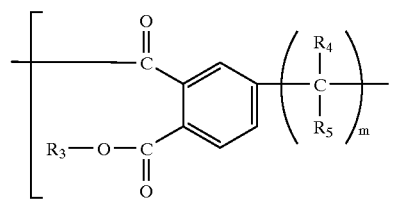

I

| INGREDIENT | COMPOSITION C | COMPOSITION D | COMPOSITION E | COMPOSITION F |
|---|---|---|---|---|
| Tetraethyleneglycol diacrylate (Sartomer) | 1.072 | 2.149 | 0 | 1.072 |
| Tris(2-hydroxyethyl)-isocyanurate triacrylate (Sartomer) | 1.072 | 0 | 2.149 | 1.072 |
| Polyamic acid ester * (DuPont KG-10602) | 4.287 | 2.406 | 2.406 | 2.406 |
| Photosensitive copolyester ** (Eastman Kodak) | 0 | 1.881 | 1.881 | 1.881 |
| Bis(trichloromethyl)-1-naphthyltriazine | 0.437 | 0.437 | 0.437 | 0.437 |
| 3,3'-carbonylbis(5,7-di-n-propoxycoumarin) (Eastman Kodak) | 0.087 | 0.087 | 0.087 | 0.087 |
| CG 21-1005 oxonol dye (Ciba Geigy) | 0.122 | 0.122 | 0.122 | 0.122 |
| Byk-307 silicone surfactant (Byk Chemie) | 0.012 | 0.012 | 0.012 | 0.012 |
| Tetrahydrofuran | 24.156 | 24.155 | 24.155 | 24.156 |
| Butyrolactone | 12.078 | 12.078 | 12.078 | 12.078 |
| Toluene | 11.149 | 11.149 | 11.149 | 11.149 |
| 1-Methoxy-2-propanol | 45.526 | 45.523 | 45.523 | 45.526 |

* ** As in Example 1.

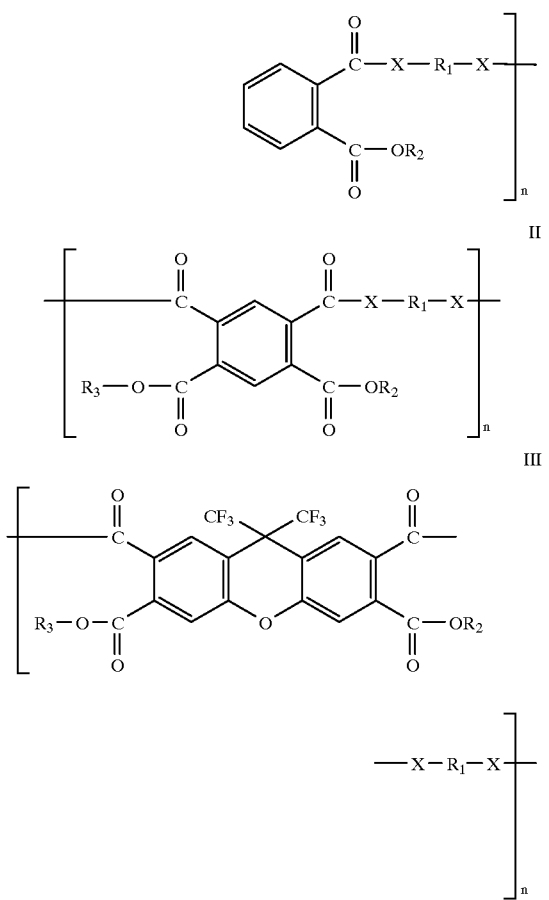

wherein X is —NH— or —O—,

R₁ is a divalent aromatic, cycloaliphatic or aliphatic group having at least 2 carbon atoms, R₂ and R₃ are independently hydrogen or an organic radical containing a photopolymerizable olefinic double bond, provided at least one of R₂ and R₃ is said organic radical, R₄ and R₅ are each independently a hydrocarbon group having 1 to 8 carbon atoms, or a perfluoro or perhalofluoro aliphatic group having 1 to 8 carbon atoms, or together R₄ and R₅ form an oxo group, m is 0 or 1, and n is a positive integer corresponding to the number of units in the polymer and is sufficiently large to provide said resin a) with a number average molecular weight of at least about 1500.

2. The composition of claim 1 wherein R₁ is arylene or aryleneoxyarylene.

3. The composition of claim 2 wherein R₂ and R₃ are each an organic radical containing a photopolymerizable olefinic double bond.

4. The composition of claim 1 wherein R₄ and R₅ are each a perfluoro aliphatic group or together form an oxo group.

5. The composition of claim 1 wherein n is a positive integer sufficiently large to provide said resin a) with a number average molecular weight of from about 1500 to about 35,000.

6. The composition of claim 1 wherein said polyalkyleneglycol diacrylate is selected from the group consisting of diethyleneglycol diacrylate, diethyleneglycol dimethacrylate, triethyleneglycol diacrylate, triethyleneglycol dimethacrylate, tetraethyleneglycol diacrylate, tetraethyleneglycol dimethacrylate, tri-n-propyleneglycol diacrylate, tri-n-propyleneglycol dimethacrylate, tri-isopropyleneglycol diacrylate, tri-isopropyleneglycol dimethacrylate, di-n-butyleneglycol diacrylate, di-n-butyleneglycol dimethacrylate, diethyleneglycol-tri-isopropyleneglycol diacrylate, diethyleneglycol-tri-isopropyleneglycol dimethacrylate, and mixtures thereof, and said polyacrylate is selected from the group consisting of trimethylolpropane trimethacrylate, trimethylolpropane triacrylate, ethoxylated trimethylolpropane triacrylate, ethoxylated trimethylolpropane trimethacrylate, tetramethylolpropane tetraacrylate, pentaerythritol triacrylate, tris(2-hydroxyethyl) isocyanurate triacrylate, and mixtures thereof.

7. The composition of claim 6 wherein said photopolymerizable polyalkyleneglycol diacrylate is tetraethyleneglycol diacrylate and said photopolymerizable polyacrylate is pentaerythritol triacrylate or tris(2-hydroxyethyl) isocyanurate triacrylate.

8. The composition of claim 1 wherein said photosensitive polyester has aromatic groups and a photosensitive —CH=CH—CO— group.

9. The composition of claim 1 wherein said photoinitiator is a halogenated triazine.

10. The composition of claim 1 wherein said photosensitizer is a coumarin or a thiazoline compound.

11. The composition of claim 1 wherein the weight ratio of the total of said resin a) and resin d) to said monomers b) and c) is at least 2.25:1.

12. The composition of claim 1 wherein the weight ratio of the total of said resin a) and resin d) to said monomers b) and c) is from 2.5:1 to 4:1.

13. The composition of claim 1 further comprising a photocrosslinkable copolymer of maleic anhydride and styrene or a copolymer of maleic anhydride and a styrene derivative.

14. The composition of claim 1 wherein said resin a) is present in an amount of from about 15 to about 65%, the total of said diacrylate and polyacrylate monomers is from about 15 to about 50%, said photocrosslinkable polyester resin is present in an amount of from about 15 to about 65%, said photoinitiator is present in an amount of from about 0.5 to about 15%, and photosensitizer is present in an amount of from about 0.1 to 15%, based on dry coating weight.

15. The photosensitive element of claim 1 wherein X is —NH—.

16. A photosensitive element comprising a support and having thereon a photosensitive image-forming layer, said photosensitive image-forming layer comprising:

a) a resin containing ethylenically unsaturated photocrosslinkable groups, b) a photopolymerizable polyalkyleneglycol diacrylate, c) a photopolymerizable polyacrylate, d) a photocrosslinkable polyester resin, e) a photoinitiator, and f) a photosensitizer, the weight ratio of the total of said resin a) and resin d) to said monomers b) and c) being at least 1.5:1, said resin a) having any of structures I, II or III:

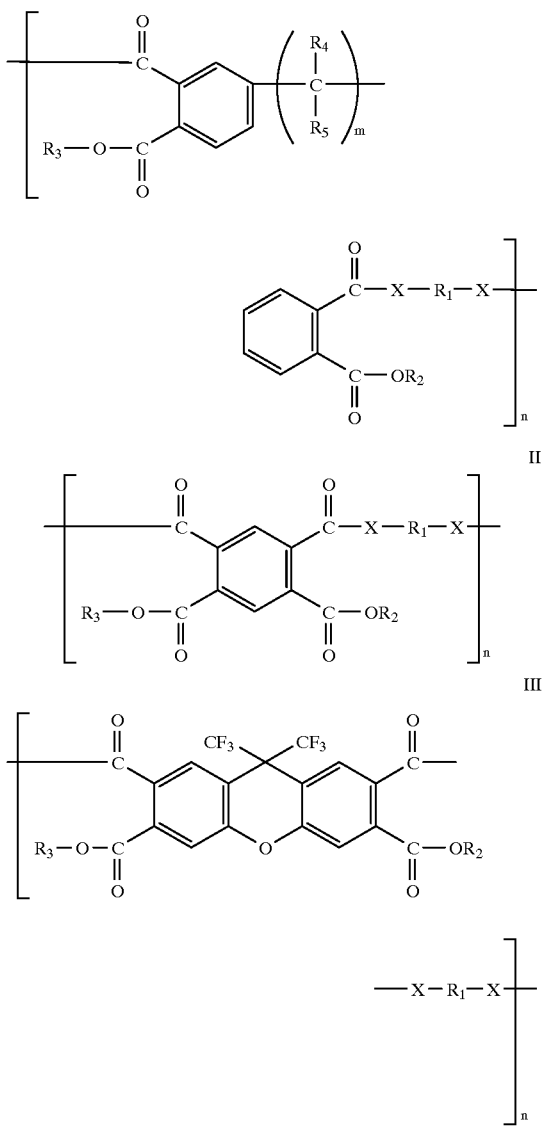

wherein X is —NH— or —O—,

R$_1$ is a divalent aromatic, cycloaliphatic or aliphatic group having at least 2 carbon atoms, R$_2$ and R$_3$ are independently hydrogen or an organic radical containing a photopolymerizable olefinic double bond, provided at least one of R$_2$ and R$_3$ is said organic radical, R$_4$ and R$_5$ are each independently a hydrocarbon group having 1 to 8 carbon atoms, or a perfluoro or perhalofluoro aliphatic group having 1 to 8 carbon atoms, or together R$_4$ and R$_5$ form an oxo group, m is 0 or 1, and n is a positive integer corresponding to the number of units in the polymer and is sufficiently large to provide said resin a) with a number average molecular weight of at least about 1500.

17. The photosensitive element of claim 16, wherein R$_1$ is arylene or aryleneoxyarylene, at least one of R$_2$ and R$_3$ is an organic radical containing a photopolymerizable double bond, R$_4$ and R$_5$ are each a perfluoro aliphatic group or together R$_4$ and R$_5$ form an oxo group, and n is a positive integer sufficiently large to provide said resin a) with a number average molecular weight of from about 1500 to about 35,000.

18. The photosensitive element of claim 16 wherein said diacrylate is tetraethyleneglycol diacrylate, said polyacrylate is pentaerythritol triacrylate or tris(2-hydroxyethyl) isocyanurate triacrylate, said photosensitive polyester has aromatic groups and photosensitive —CH=CH—CO— groups, said photoinitiator is a halogenated triazine, and said photosensitizer is a coumarin or thiazoline compound.

19. The photosensitive element of claim 16 wherein the weight ratio of the total of said resin a) and resin d) to said monomers b) and c) is at least 2.25:1.

20. The photosensitive element of claim 16 wherein said support is treated or untreated aluminum.

21. The photosensitive element of claim 16 wherein X is —NH—.

22. A lithographic printing plate comprising an anodized or grained aluminum support and having thereon a photosensitive image-forming layer and a protective overcoat layer, said photosensitive image-forming layer comprising:

a) a polyamide containing ethylenically unsaturated photocrosslinkable groups, b) tetraethyleneglycol diacrylate, c) pentaerythritol triacrylate or tris(2-hydroxyethyl) isocyanurate triacrylate, d) a photocrosslinkable polyester resin containing aromatic groups and photosensitive —CH=CH—CO— groups, e) a halogenated triazine photoinitiator, and f) a coumarin or thiazoline sensitizer that has an absorption maximum of from about 250 to about 550 nm, the weight ratio of the total of said resin a) and resin d) to said monomers b) and c) being from 2.25:1 to 4:1, said resin a) comprises repeating units of the structure:

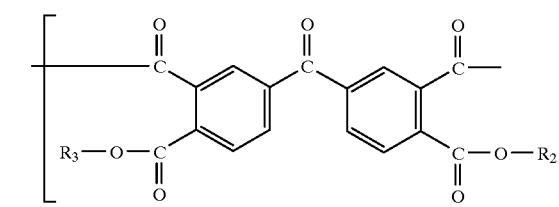

wherein R$_1$ is phenylene or phenyleneoxyphenylene,

R$_2$ and R$_3$ are each —CH$_2$CH$_2$OCOC(CH$_3$)=CH$_2$, n is a positive integer corresponding to the number of units in the polymer and is sufficiently large to provide said resin a) with a number average molecular weight of from about 1500 to about 35,000.

23. The photosensitive element of claim 17 wherein X is —NH—.

* * * * *